US008080837B2

(12) United States Patent  (10) Patent No.: US 8,080,837 B2
Mouli  (45) Date of Patent: Dec. 20, 2011

(54) MEMORY DEVICES, TRANSISTORS, AND MEMORY CELLS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1079 days.

(21) Appl. No.: 11/408,874

(22) Filed: Apr. 19, 2006

(65) Prior Publication Data

US 2006/0197137 A1  Sep. 7, 2006

Related U.S. Application Data

(62) Division of application No. 10/902,297, filed on Jul. 28, 2004, now Pat. No. 7,598,134.

(51) Int. Cl.
H01L 29/78 (2006.01)
(52) U.S. Cl. .......... 257/288; 257/77; 257/296; 257/329; 257/E27.084; 257/E27.098; 257/E27.103; 257/E29.262
(58) Field of Classification Search ............ 257/77, 257/288, 296, E33.035, E27.084, E27.098, 257/E27.103, E29.255, E29.262, 329
See application file for complete search history.

(56) References Cited

U.S. PATENT DOCUMENTS

| 5,510,630 | A | 4/1996 | Agarwal |
| 5,514,604 | A | 5/1996 | Brown |
| 5,672,889 | A * | 9/1997 | Brown ............... 257/77 |
| 5,734,181 | A | 3/1998 | Ohba et al. |
| 5,742,076 | A | 4/1998 | Sridevan et al. |
| 5,831,337 | A | 11/1998 | Sato |
| 6,011,278 | A | 1/2000 | Alok et al. |
| 6,150,671 | A | 11/2000 | Harris et al. |
| 6,222,217 | B1 | 4/2001 | Kunikiyo |
| 6,246,091 | B1 | 6/2001 | Rodder |
| 6,278,133 | B1 | 8/2001 | Harris et al. |
| 6,323,506 | B1 | 11/2001 | Alok |
| 6,355,944 | B1 | 3/2002 | Alok |
| 6,372,618 | B2 | 4/2002 | Forbes et al. |
| 6,552,363 | B2 | 4/2003 | Sridevan |
| 6,600,192 | B1 | 7/2003 | Sugawara et al. |
| 6,627,924 | B2 | 9/2003 | Hsu et al. |
| 6,665,203 | B2 * | 12/2003 | Fujisawa et al. ............. 365/51 |

(Continued)

FOREIGN PATENT DOCUMENTS

EP 1104028 A2 11/2001

(Continued)

OTHER PUBLICATIONS

Planson D et al., "Design of a 600 V Silicon Carbide Vertical Power MOSFET", Materials Science and Engineering B, Elsevier Sequoia, Lausanne, CH, vol. 61-62, Jul. 30, 1999, pp. 497-501.

(Continued)

Primary Examiner — Mary Wilczewski
Assistant Examiner — Toniae Thomas
(74) Attorney, Agent, or Firm — Wells St. John P.S.

(57) ABSTRACT

A memory device includes an array of memory cells and peripheral devices. At least some of the individual memory cells include carbonated portions that contain SiC. At least some of the peripheral devices do not include any carbonated portions. A transistor includes a first source/drain, a second source/drain, a channel including a carbonated portion of a semiconductive substrate that contains SiC between the first and second sources/drains and a gate operationally associated with opposing sides of the channel.

26 Claims, 8 Drawing Sheets

U.S. PATENT DOCUMENTS

| | | | |
|---|---|---|---|
| 6,737,704 B1 * | 5/2004 | Takemori et al. | 257/329 |
| 7,078,723 B2 | 7/2006 | Lin et al. | |
| 7,109,548 B2 | 9/2006 | Forbes et al. | |
| 7,151,024 B1 | 12/2006 | Forbes | |
| 7,439,594 B2 | 10/2008 | Mouli | |
| 2001/0055838 A1 | 12/2001 | Walker et al. | |
| 2002/0022324 A1 * | 2/2002 | Hueting et al. | 438/270 |
| 2003/0022471 A1 | 1/2003 | Taketomi et al. | |
| 2003/0235076 A1 | 12/2003 | Forbes | |
| 2005/0067630 A1 | 3/2005 | Zhao | |
| 2005/0230763 A1 | 10/2005 | Huang et al. | |

FOREIGN PATENT DOCUMENTS

| | | |
|---|---|---|
| JP | 63 204766 A | 8/1988 |
| JP | 93 160410 | 6/1993 |
| JP | 10 284724 A | 10/1998 |
| JP | 11 163329 | 6/1999 |
| JP | 11 261068 | 9/1999 |
| JP | 11 297712 | 10/1999 |
| JP | 00 269496 | 9/2000 |
| JP | 00 357749 | 12/2000 |
| TW | 495810 B | 7/2002 |
| WO | WO 2004/015782 | 2/2004 |

OTHER PUBLICATIONS

Abdou et al, Comparison of Different Metal Additive to Si for the Homoepitaxial Growth of 4H-SiC Layers by Vapour-Liquid-Solid Mechanism, International Conference on Silicon Carbide and Related Materials (ICSCRM), Oct. 5-10, 2003, Lyon, France.

Hernandez et al, Low Temperature ECR-PECVD Microcrystalline SiC Growth by Pulsed Gas Flows, International Conference on Silicon Carbide and Related Materials (ICSCRM), Oct. 5-10, 2003, Lyon, France.

Chassagne, et al, Investigation of 2 inch 3C-SiC Layers Grown in a Resistively-Heated LP-CVD Reactor with Horizontal "Hot-Walls," International Conference on Silicon Carbide and Related Materials (ICSCRM), Oct. 5-10, 2003, Lyon, France.

Ernst et al, A New Si:C Epitaxial Channel nMOSFET Architecture with Improved Drivability and Short-Channel Characteristics, Jun. 10-12, 2003 Symposium on VLSI Technology Digest of Technical Papers.

Ernst et al, Fabrication of a Novel Strained SiGe:C-Channel Planar 55nm nMOSFET for High-Performance CMOS, Jun. 11-13, 2002 Symposium on VLSI Technology Digest of Technical Papers, p. 92-93.

Kim et al, The Breakthrough in Data Retention Time of DRAM Using Recess-Channel-Array Transistor (RCAT) for 88nm Feature Size and Beyond, Jun. 10-11, 2003 Symposium on VLSI Technology Digest of Technical Papers.

Eickhoff et al, Selective Growth of High-Quality 3C-SiC Using a SiO2 Sacrificial-Layer Technique, Thin Solid Films, 345 (1999) p. 197-199.

W. Xie et al., "Development of Nonvolatile Random Access Memories in 6H-SiC", Silicon Carbide and Related Materials 1995 Conference, Kyoto, Japan. IOP Publishing (1996), pp. 785-788.

W. Xie et al. Institute of Physics: "Cell Design and Peripheral Logic for Nonvolatile Random Access Memories in 6H-SiC", Proceedings of the 21st Int'l. Symp. Compound Semiconductors, San Diego, Sep. 18-22, 1994. IOP Publishing (1994), pp. 395-398.

Kubo, Naoki et al. "Growth of SiC films using tetraethylsilane" International Conference of Silicon Carbide and Related Materials (ICSCRM), Oct. 5-10, 2003, Lyon, France, 2 pages.

PCT/US2005/026365, International Search Report dated Apr. 19, 2006.

PCT/US2005/026365, Written Opinion of the Int'l Searching Authority dated Apr. 19, 2006.

* cited by examiner

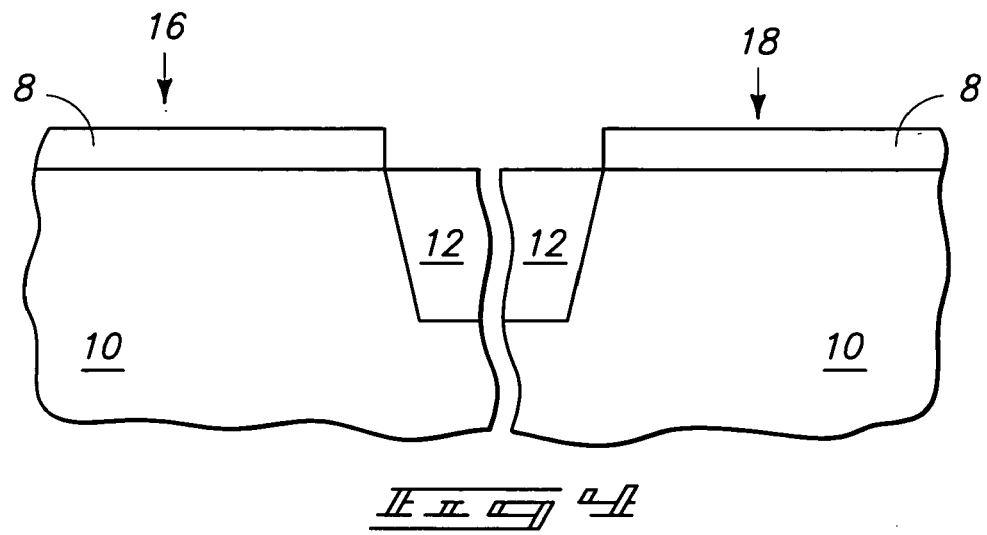
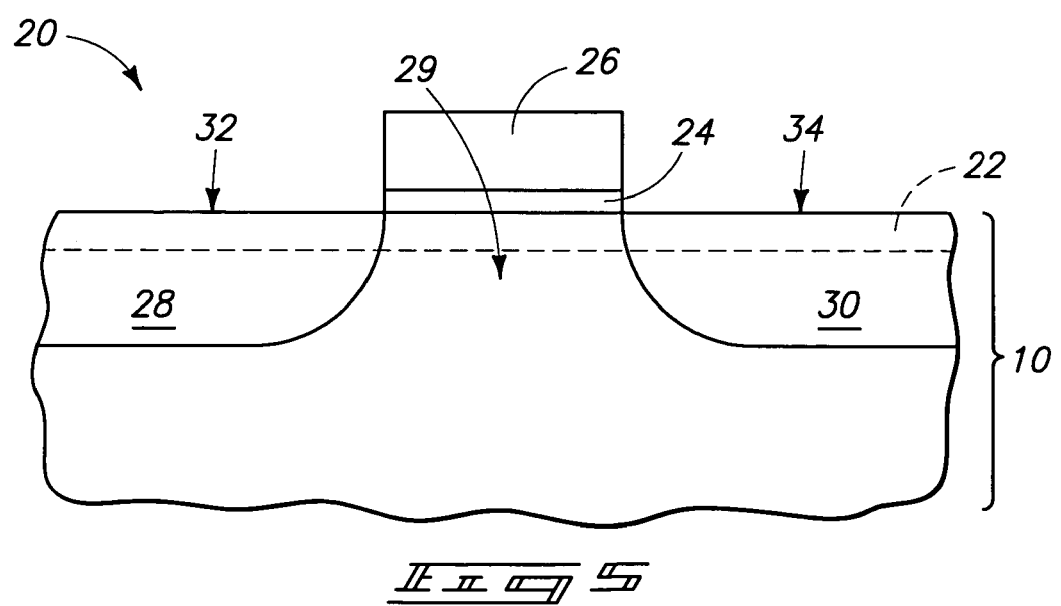

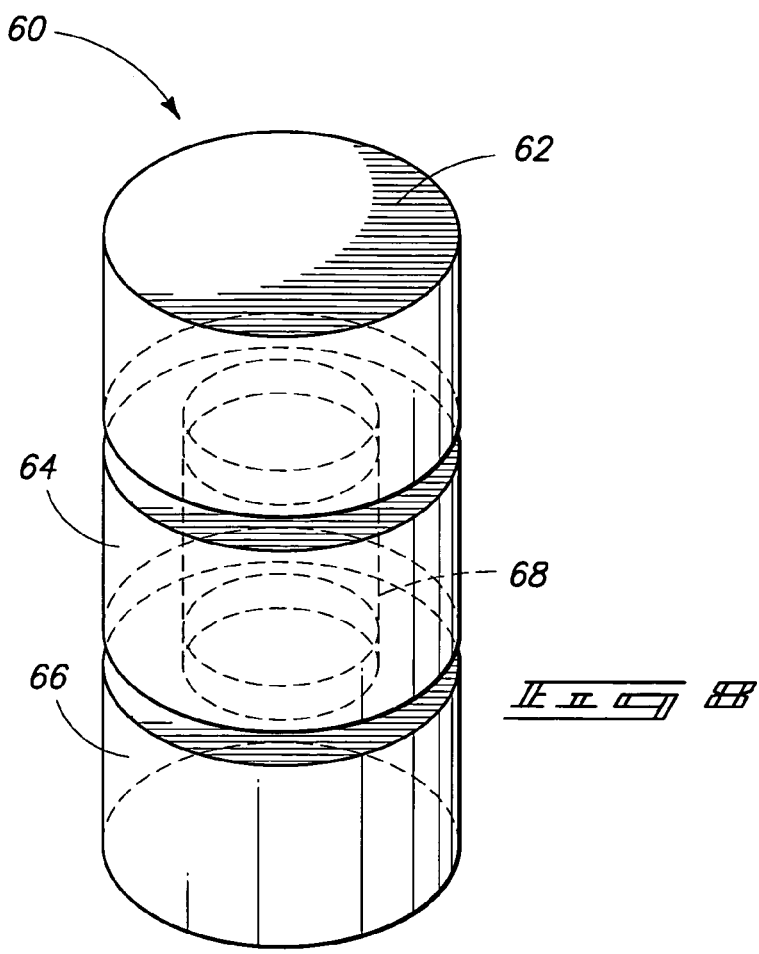
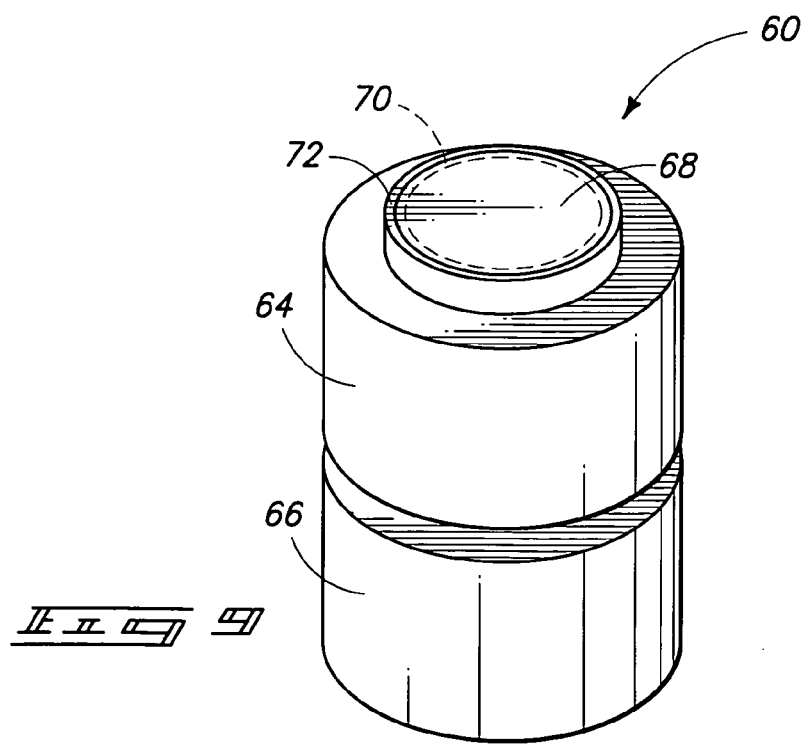

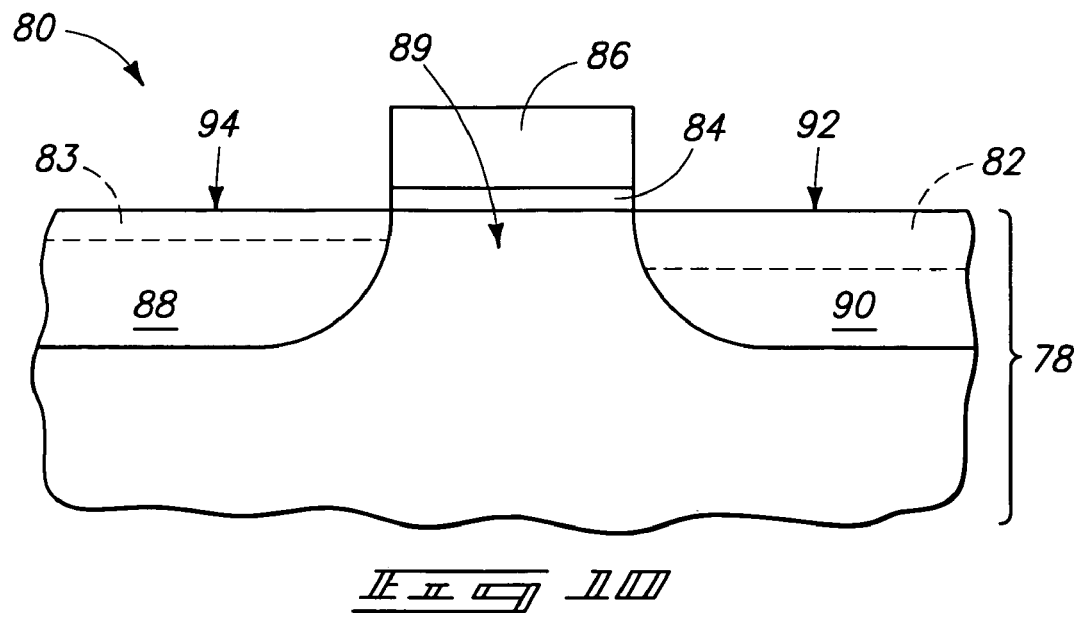
_Fig. 10_
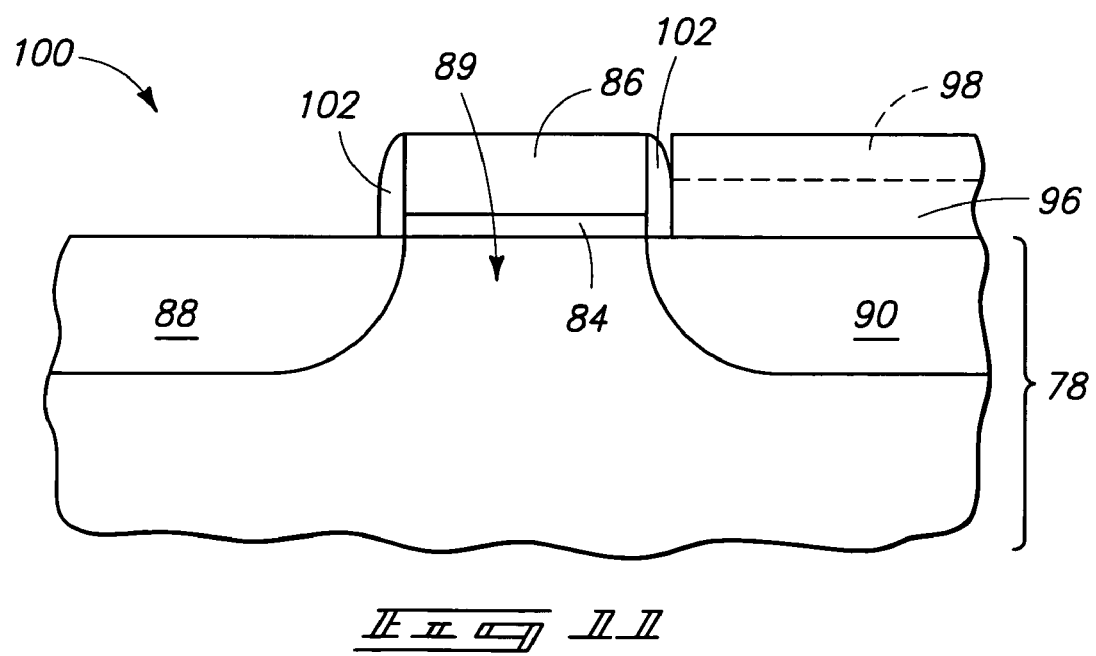
_Fig. 11_

MEMORY DEVICES, TRANSISTORS, AND MEMORY CELLS

RELATED PATENT DATA

This application is a divisional of U.S. patent application Ser. No. 10/902,297, which was filed on Jul. 28, 2004, now U.S. Pat. No. 7,598,134, and which is incorporated by reference herein.

TECHNICAL FIELD

The invention pertains to memory devices, memory cells, transistors, and methods of making such apparatuses that use SiC semiconductive material.

BACKGROUND OF THE INVENTION

In fabricating semiconductor devices, a trade-off typically exists between low leakage current and high drive current. Semiconductive materials exhibiting a high band gap normally provide a low leakage current, conversely, semiconductive materials exhibiting a low band gap normally provide a relatively high drive current. Elemental silicon exhibits a band gap of about 1.1 electron-volts (eV) which is a relatively low band gap providing acceptable drive currents. However, leakage currents can be a problem in certain applications, for example, memory devices. In memory devices, frequent refreshing may be used to address the leakage currents associated with elemental silicon as the semiconductive material in such devices.

In an attempt to reduce the refresh frequency in memory devices, it may be desirable to use alternative semiconductive materials that exhibit a higher band gap than elemental silicon. However, caution may be exercised to avoid integration problems of introducing a different semiconductive material. A different semiconductive material might result in significant processing changes and/or integrated circuit design changes to accommodate the different electronic properties and/or chemical interactions with other materials in the devices. Other apparatuses, in addition to memory devices, may potentially benefit from lessons learned when incorporating higher band gap semiconductive material into memory devices.

SUMMARY OF THE INVENTION

According to one aspect of the invention, a memory device includes a semiconductive substrate, an array of memory cells over the substrate, and peripheral devices including memory cell addressing circuitry and memory cell read circuitry over the substrate. At least some of the individual memory cells include carbonated portions of the semiconductive substrate that contain SiC. At least some of the peripheral devices do not include any carbonated portions of the semiconductive substrate.

According to another aspect of the invention, a memory device forming method includes providing a semiconductive substrate, forming carbonated portions of the semiconductive substrate that contain SiC, forming an array of memory cells over the substrate, and forming peripheral devices including memory cell addressing circuitry and memory cell read circuitry over the substrate. At least some of the individual memory cells include the carbonated portions. At least some of the peripheral devices do not include the carbonated portions.

In further aspect of the invention, a transistor includes a semiconductive substrate, a first source/drain, a second source/drain, a channel including a carbonated portion of the semiconductive substrate that contains SiC between the first and second sources/drains and a gate operationally associated with opposing sides of the channel.

In a further aspect of the invention, a memory cell includes a semiconductive substrate, a first transistor source/drain region in the semiconductive substrate, a second transistor source/drain region in the semiconductive substrate, and a transistor channel that does not contain SiC between the first and second source/drain regions. A storage node junction is on the first source/drain region and a digit node junction is on the second source/drain region. The storage node junction and/or digit node junction include a carbonated portion of the semiconductive substrate that contains SiC.

BRIEF DESCRIPTION OF THE DRAWINGS

Preferred embodiments of the invention are described below with reference to the following accompanying drawings.

FIG. 4 is a partial, sectional view of the FIG. 1 substrate at an initial process step according to an alternative aspect of the invention.

FIG. 5 is a partial, sectional view of a transistor containing SiC according to one aspect of the invention.

FIGS. 8 and 9 are partial, perspective views of a transistor containing SiC according to a further aspect of the invention.

FIG. 10 is partial, sectional view of a transistor containing SiC according to a still further aspect of the invention.

FIG. 11 is a partial, sectional view of a transistor containing SiC according to yet another aspect of the invention.

DETAILED DESCRIPTION OF THE PREFERRED EMBODIMENTS

Figure 1:
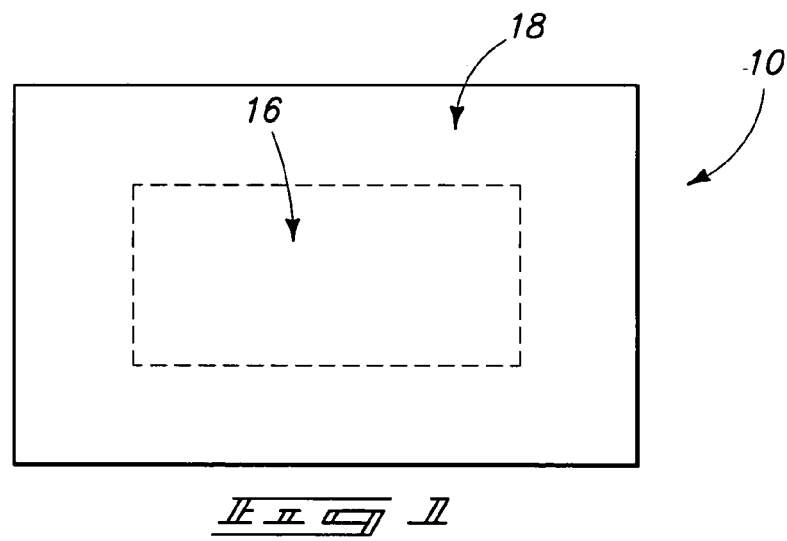
FIG. 1 is a top view of a semiconductor substrate.

Silicon carbide (SiC) constitutes one promising material for performance improvements in transistors and memory devices. SiC, depending upon its particular form, exhibits a band gap greater than about 3.0 eV compared to 1.1 eV for silicon. As such, SiC produces a very low intrinsic carrier concentration that is about 16 orders of magnitude lower than the intrinsic carrier concentration for silicon. Thermal generation of charge carriers corresponds directly to the intrinsic carrier concentration. Accordingly, leakage currents in SiC substrates can be almost negligible in comparison to leakage current in silicon substrates. Previously, metal oxide semiconductor (MOS) power devices and other special purpose applications have used SiC. However, technological challenges in fabricating high quality SiC substrates have kept SiC prohibitively expensive for commodity applications, such as logic and memory. Recent conventional advances in SiC epitaxial growth raise the possibility of considering SiC for a substrate material in commodity transistors and memory devices. Even so, a variety of integration issues are apparent.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Three polytypes are known for the cubic (C) and hexagonal (H) SiC crystal structures, namely 3C-SiC, 4H-SiC, and 6H-SiC, that exhibit slightly different physical and electrical properties as shown in Table 1. 4H-SiC and 6H-SiC represent the most commonly used polytypes for semiconductor devices.

TABLE 1

| | 4H—SiC | 6H—SiC | Silicon |
| --- | --- | --- | --- |
| Band gap Energy (eV) | 3.26 | 3.03 | 1.12 |
| Maximum Drift Velocity (cm/sec at $E = 2 \times 10^5$ V/cm) | $2.0 \times 10^7$ | $2.0 \times 10^7$ | $1.0 \times 10^7$ |
| Thermal Conductivity (W/cm-K at 300 K) | 3.0–3.8 | 3.0–3.8 | 1.5 |
| Breakdown Electric Field (V/cm) | $2.2 \times 10^6$ | $2.4 \times 10^6$ | $0.25 \times 10^6$ |

As may be appreciated from Table 1, SiC provides a superior substrate material compared to silicon at least due to its very low leakage current, excellent heat dissipation allowing high temperature operation, and ability to sustain high electric fields. In applications where such factors dominate, SiC substrates provide tremendous benefits over silicon substrates. Even so, little if any inroads have been made incorporating SiC as substrate materials in memory devices and other devices at least due to the lack of availability of SiC substrates (at least partly due to high cost of fabrication), unacceptable defect densities, and poor carrier mobility.

Within the memory array region of a memory device, poor carrier mobility is of lesser consequence in comparison to the peripheral device region. That is, a dominating factor within the memory array region is leakage current (especially at junctions) and, to a lesser extent, device speed. On the contrary, in the peripheral device region, a predominant factor is device speed and, to a lesser extent, leakage current. In the memory array region, leakage current at least partly determines the time lapse between refresh of the devices in the memory array. Accordingly, performance enhancements may be obtained by increasing the time between each refresh.

The various aspects of the invention described herein incorporate SiC into transistors and memory devices in previously unknown manners taking advantage of the distinguishing characteristics of SiC compared to silicon. According to one aspect of the invention, a memory device includes a semiconductive substrate, an array of memory cells over the substrate, and peripheral devices including memory cell addressing circuitry and memory cell read circuitry over the substrate. At least some of the individual memory cells include carbonated portions of the semiconductive substrate that contain SiC. At least some of the peripheral devices do not include any carbonated portions of the semiconductive substrate.

FIG. 1 shows a top view of a substrate 10 having a memory array region 16 and a peripheral device region 18 surrounding memory array region 16. Although in FIG. 1 peripheral device region 18 is situated around a periphery of substrate 10, the term "peripheral device" refers primarily to the function of such a device rather than merely to its location. Conventionally, the "memory array" portion of a memory device containing memory cells is located centrally on the substrate, such as substrate 10, supporting the memory device. "Peripheral devices" including memory cell addressing circuitry and memory cell read circuitry, among other devices, are then located in the periphery around the central memory array. However, alternate positioning of the memory array region and the peripheral device region is conceivable and encompassed by the aspects of the invention described herein.

In the present aspect of the invention, the carbonated portions of the semiconductive substrate that contain SiC included in at least some of the individual memory cells may be incorporated into a wide variety of designs for memory devices. Preferably, at least one component of each of the individual memory cells in the array includes one of the carbonated portions. Also, preferably none of the peripheral devices include one of the carbonated portions. Even so, while such preferences optimize the opportunity for performance enhancements, other less preferred configurations are encompassed by the present aspect of the invention and may still obtain some advantages available by incorporating SiC into semiconductive material.

In most of the components that may be selected to contain SiC, the carbonated portions may be conductively doped. The semiconductive substrate may also have a variety of configurations and compositions. For example, the semiconductive substrate may include monocystalline silicon. The semiconductive substrate may include expitaxial silicon. The semiconductive substrate may be part of a bulk silicon wafer or may be part of a semiconductor-on-insulator (SOI) configuration.

Given the variety of opportunities for incorporating SiC into a memory device, a variety of methods are conceivable for accomplishing such incorporation. Essentially, SiC may be incorporated into any semiconductive substrate in conventional memory devices provided at least one of the advantages described herein may be achieved. Recent conventional advancements in SiC epitaxial growth present a promising methodology for incorporating SiC into semiconductive substrates. Ion implanting and/or gas diffusing of carbon into a semiconductive substrate, as well as other known methods, present alternatives for incorporating SiC into semiconductive substrates.

Tetraethyl silane ((TES); $Si(C_2H_5)_4$) constitutes one suitable precursor for SiC epitaxial growth. TES is liquid at room temperature and easily integrated into a conventional complementary metal-oxide-semiconductor (CMOS) process flow. A carbon concentration of from about 0.2 to about 2.5 atomic % carbon in silicon may be suitable to obtain the advantageous SiC properties. Preferably, from about 0.5 to about 1.5 atomic % carbon in silicon is provided.

According to another aspect of the invention, a memory device forming method includes providing a semiconductive substrate, forming carbonated portions of the semiconductive substrate that contain SiC, forming an array of memory cells over the substrate, and forming peripheral devices including memory cell addressing circuitry and memory cell read circuitry over the substrate. At least some of the individual memory cells include the carbonated portions. At least some of the peripheral devices do not include the carbonated portions.

Forming the carbonated portions may include forming a masking layer over a memory array region and peripheral device region of the semiconductive substrate, removing the masking layer from over the memory array region, and forming a SiC layer in contact with the memory array region. The method includes not forming the SiC layer in contact with the peripheral device region and removing the masking layer from over the peripheral device region.

Figure 2:
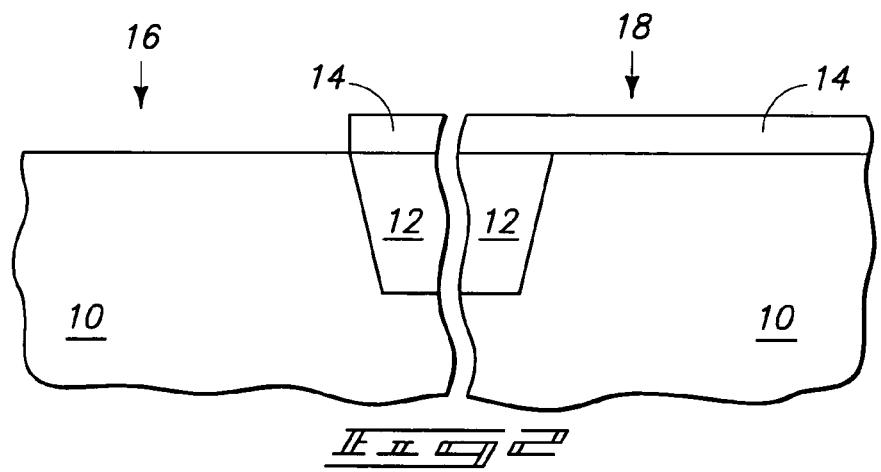
FIG. 2 is a partial, sectional view of the substrate shown in FIG. 1 at an initial process step according to one aspect of the invention.

FIG. 2 shows a partial sectional view of substrate 10 from FIG. 1 including memory array region 16 and peripheral device region 18. Isolation 12 is formed in substrate 10 and a mask 14 is formed over isolation 12 and peripheral device region 18 with the objective of preventing formation of a SiC layer in contact with peripheral device region 18. As an alternative, mask 14 may be formed exclusively over peripheral device region 18 and still provide the objective of preventing formation of a SiC layer in contact with peripheral device region 18. Silicon nitride constitutes one possibility for a suitable mask 14.

Figure 3:
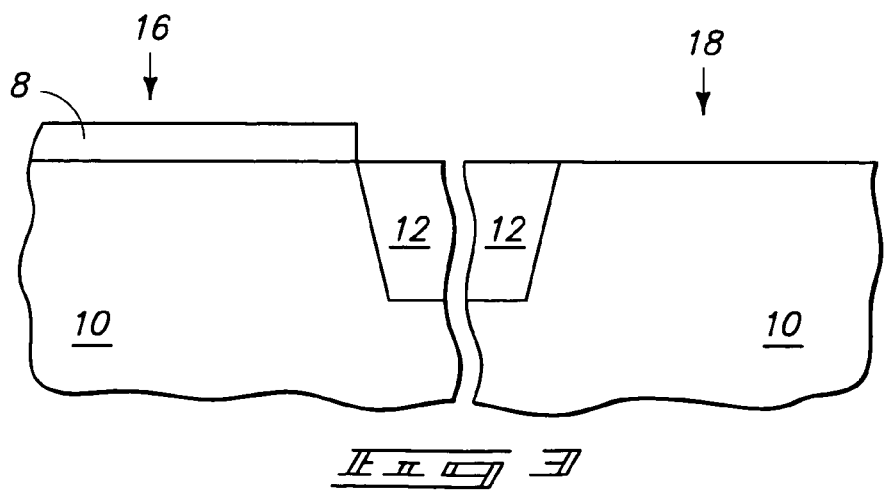
FIG. 3 is a partial, sectional view of the FIG. 2 substrate at a subsequent process step.

Subsequent to forming mask 14, a SiC layer 8, such as shown in FIG. 3 may be formed in contact with memory array region 16, but not in contact with peripheral device region 18. Selective contact of SiC layer 8 with the respective regions may be accomplished either by selective growth and/or deposition of SiC layer 8 on memory array region 16 or non-selective formation of SiC layer 8 over substrate 10 with mask 14 separating SiC layer 8 from contact with peripheral device region 18. SiC layer 8 is shown in FIG. 3 as added material upon memory array region 16. However, SiC layer 8 may instead be formed within substrate 10, for example, by ion implanting and/or gas diffusing carbon. In such case, the elevational level of substrate 10 might not increase as it does in FIG. 3 when the added material of SiC layer 8 increases the original elevational level of substrate 10. Removing mask 14 along with any portion of SiC layer 8 from over isolation 12 and peripheral device region 18 provides the construction shown in FIG. 3.

As an alternative method, forming the carbonated portions may include forming a SiC layer in contact with a memory array region and a peripheral device region of the semiconductive substrate, removing the SiC layer from over the peripheral device region, and leaving the SiC layer on at least a portion of the memory array region. FIG. 4 shows a partial sectional view of substrate 10 in FIG. 1 with SiC layer 8 formed over memory array region 16 as well as peripheral device region 18. SiC layer 8 is not shown formed over isolation 12, however, it may be formed thereon depending upon the particular method selected for forming SiC layer 8. Removal of SiC layer 8 from over peripheral device region 18 produces the construction shown in FIG. 3. As may be appreciated from the examples herein of specific devices incorporating SiC, alternative methods may be used to incorporate SiC into such devices.

In the memory device including an array of memory cells and peripheral devices over a semiconductive substrate, at least some of the individual memory cells may contain a planar SiC layer in the semiconductive substrate. The individual memory cells may contain a transistor that includes the SiC layer in a first source/drain, a second source/drain, and a channel between the first and second sources/drains. FIG. 5 shows a partial, sectional view of selected components of a transistor 20 that may be included in an array of memory cells.

Transistor 20 includes a SiC layer 22 as a part of substrate 10, a source/drain region 28, and a source/drain region 30 with a channel 29 between the source/drain regions 28, 30. A gate dielectric 24 is formed over channel 29 and a gate 26 is formed over gate dielectric 24. As may be appreciated, SiC layer 22 of substrate 10 is included in source/drain region 28, source/drain region 30, and channel 29. Transistor 20 also includes a storage node junction 32 formed within source/drain region 28 and a digit node junction 34 formed within source/drain region 30. Notably, storage/digit node junctions 32 and 34 include SiC layer 22 of source/drain regions 28 and 30.

In another aspect of the invention, a random access memory device includes a silicon substrate, an array of memory cells over the substrate, and peripheral devices including memory cell addressing circuitry and memory cell read circuitry over the substrate. Each of the individual memory cells includes a conductively doped, planar SiC layer in the semiconductive substrate and includes a transistor that contains the SiC layer in a first source/drain, a second source/drain, and a channel between the first and second sources/drains. None of the peripheral devices include any SiC layer in the semiconductive substrate.

In further aspect of the invention, a transistor includes a semiconductive substrate, a first source/drain, a second source/drain, a channel including a carbonated portion of the semiconductive substrate that contains SiC between the first and second sources/drains and a gate operationally associated with opposing sides of the channel. SiC is uniquely provided within the channel of a transistor having a gate operationally associated with opposing sides of the channel in comparison to a gate operationally associated with a single side of the channel. The SiC imparts special advantages to such constructions in comparison to transistors with gates on a single side of the channel.

So-called "3-dimensional" (3-D) devices, such as FinFET and vertical transistors, can be examples of transistors with gates on opposing sides of their channel. Accordingly, the transistor of the present aspect of the invention many include a vertical transistor with the channel elevationally above the first source/drain and the second source/drain elevationally above the channel. Also, the transistor may include a lateral transistor with some portion of each of the first source/drain, the second source/drain, the gate, and a current path through the channel sharing one common elevational level.

The transistor may further include a gate dielectric between the gate and the channel. The SiC of the channel may be located within a channel periphery proximate an interface with the gate dielectric and not be located within a channel core at least partly surrounded by the SiC. The channel core may extend from the first source/drain to the second source/drain. The SiC may have a thickness of from about 50 to about 100 Angstroms. The transistor may be included in a memory device, for example, a memory device with peripheral devices such as described above that do not include any carbonated portions of the semiconductive substrate.

Figure 6:
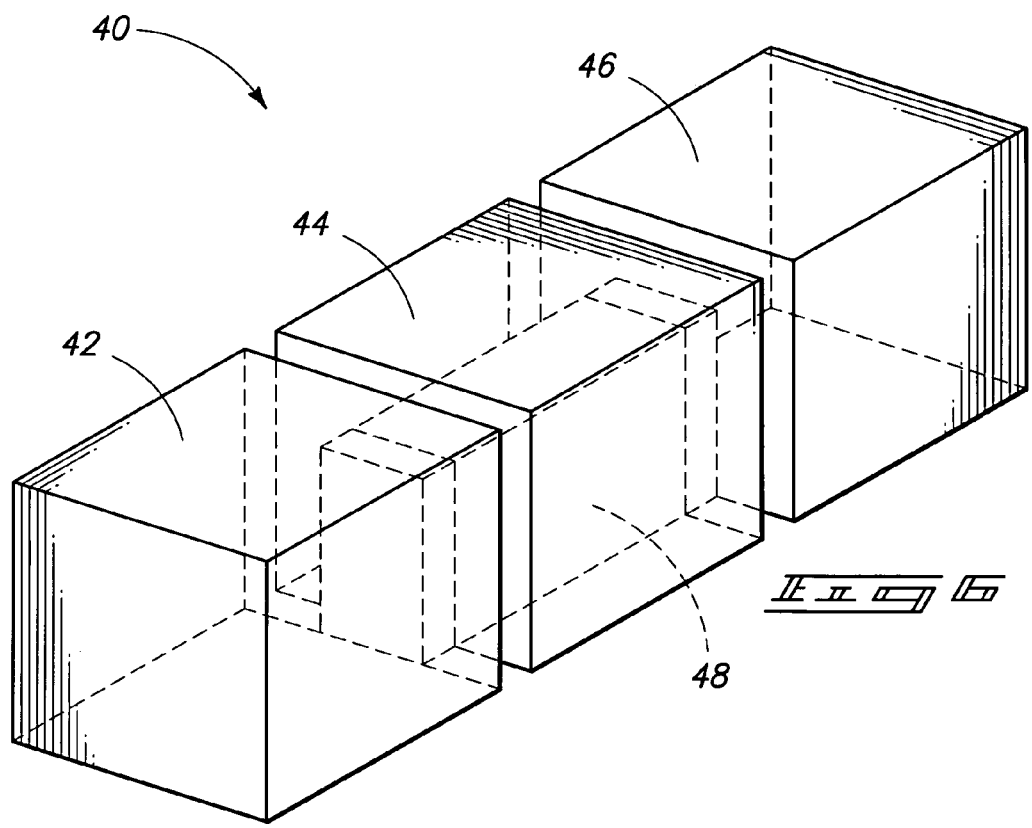
FIGS. 6 and 7 are partial, perspective views of a transistor containing SiC according to another aspect of the invention.
Figure 7:
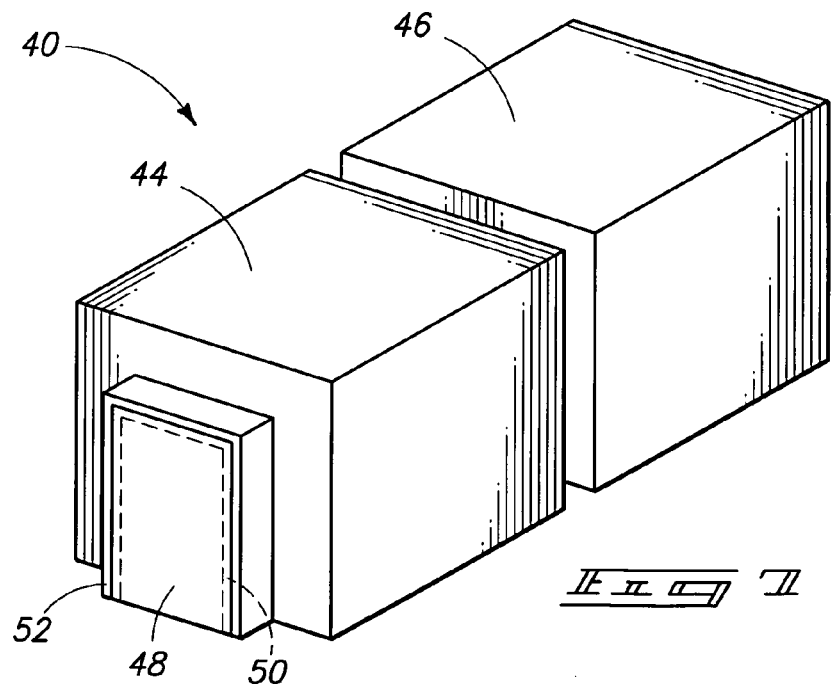

FIGS. 6 and 7 show perspective views of a 3-D transistor that might be referred to by those of ordinary skill as a "FinFET" characterized by a fin-shaped channel. 3-D transistor 40 includes a source 42, a drain 46 and a channel 48 extending from source 42 to drain 46. A gate 44 over channel 48 can be seen as operationally associated with opposing sides of channel 48. Noticeably, FIGS. 6 and 7 show only selected components of a 3-D transistor for illustration purposes and intentionally leave out other components, such as the underlying semiconductive substrate, insulation layers, diffusion regions, etc. Also, FIGS. 6 and 7 are merely exemplary of a 3-D transistor and a variety of 3-D transistors known to those of ordinary skill may be conducive to incorporation of SiC into the channels of such devices. It will be appreciated that 3-D transistor 40 may be formed on a semiconductive substrate such that it comprises a lateral transistor and, upon operation of 3-D transistor 40, a current path may be generated through channel 48. Some portion of each of source 42, drain 46, gate 44, and a current path through channel 48 may share one common elevational level.

Also, FIG. 7 shows the 3-D transistor 40 of FIG. 6 with source 42 removed to reveal details of underlying constructions. Specifically, 3-D transistor 40 includes a gate dielectric 52 between gate 44 and channel 48. SiC material 50 is provided within a channel periphery proximate an interface with gate dielectric 52, but is not located within a channel core at least partly surrounded by SiC material 50. The channel core extends from source 42 to drain 46.

One difficulty associated with incorporating SiC into a silicon substrate is that the potential stress and incompatibility at the interface between SiC and Si can produce defects and, hence, leakage currents. Such leakage becomes especially significant when the defects, if any, are in source/drain depletion regions. As known to those of ordinary skill, in 3-D transistor 40 the source/drain depletion regions may be located about the interface of channel 48 with source 42 and with drain 46. With source 42 removed in FIG. 7, the portion of channel 48 wherein the source depletion region may form is clearly shown. As further known to those of ordinary skill, one part of the source depletion region may extend from the channel 48/source 42 interface into channel 48 to a distance determined by any applied bias. Another part of the source depletion region may extend from the channel 48/source 42 interface into source 42 to a distance also determined by any applied bias. Conventionally, the depletion regions extend from about 100 to about 800 Angstroms into channel 48 and source 42 for a total depth of from about 200 to about 1600 Angstroms.

Regardless, the depletion regions may be far enough away from most defects, if any, at the interface between peripheral SiC material 50 and the channel core of channel 48 not containing SiC so that any defects produced may be of less significance. A small part of the peripheral SiC material 50 at either end of channel 48 near source 42 or drain 46 may be within depletion regions. However, the bulk of peripheral SiC material 50 extending along the length of channel 48 between source 42 and drain 46 is advantageously not within depletion regions. Accordingly, the advantages of a SiC-containing channel may still be provided by the configuration shown in FIGS. 6 and 7 even in the circumstance when incorporating SiC produces defects at the SiC/Si interface.

FIGS. 8 and 9 show perspective views of a 3-D transistor 60 oriented vertically instead of laterally. FIGS. 8 and 9 include only selected components of a typical 3-D transistor for the purposes of illustration as discussed above with regard to 3-D transistor 40. For example, the overall configuration of 3-D transistor 60 need not be cylindrical as shown in FIGS. 8 and 9. Also, selected components, such as sources/drains and channels may be integral components defined within an underlying semiconductive substrate instead of discrete components as shown. 3-D transistor 60 includes a channel 68 elevationally above a drain 66 and a source 62 elevationally above channel 68. A gate 64 is operationally associated with opposing sides of channel 68. Source 62 is removed in FIG. 9 to reveal the specific construction of channel 68.

Similarities with channel 48 of 3-D transistor 40 are apparent. For example, a gate dielectric 72 is provided between gate 64 and channel 68. A SiC material 70 is located within a periphery of channel 68 proximate an interface between gate dielectric 72 and channel 68. SiC material 70 is not located within a core of channel 68 at least partly surrounded by SiC material 70. The channel core extends from source 62 to drain 66. Also, the bulk of SiC material 70 is not within a source/drain depletion region.

The 3-D transistors 40 and 60 of FIGS. 6-9 may be produced and/or modified in accordance with any conventional method known for such purpose, except that SiC may be included in the channel of such devices in keeping with the methods described herein. Other than the indicated changes, little if any modification of conventional fabrication methods is expected to accommodate incorporation of SiC.

In another aspect of the invention, a transistor includes a semiconductive substrate, a first source/drain, a second source/drain, and a gate recessed into the semiconductive substrate between the first and second sources/drains. A channel including a carbonated portion of the semiconductive substrate that contains SiC is operationally associated with opposing sides of the gate. By way of example, a gate dielectric may be between the gate and the channel with the SiC of the channel being located within a channel periphery proximate an interface with the gate dielectric. The SiC may have a thickness of from about 50 to about 100 Angstroms.

Figure 12:
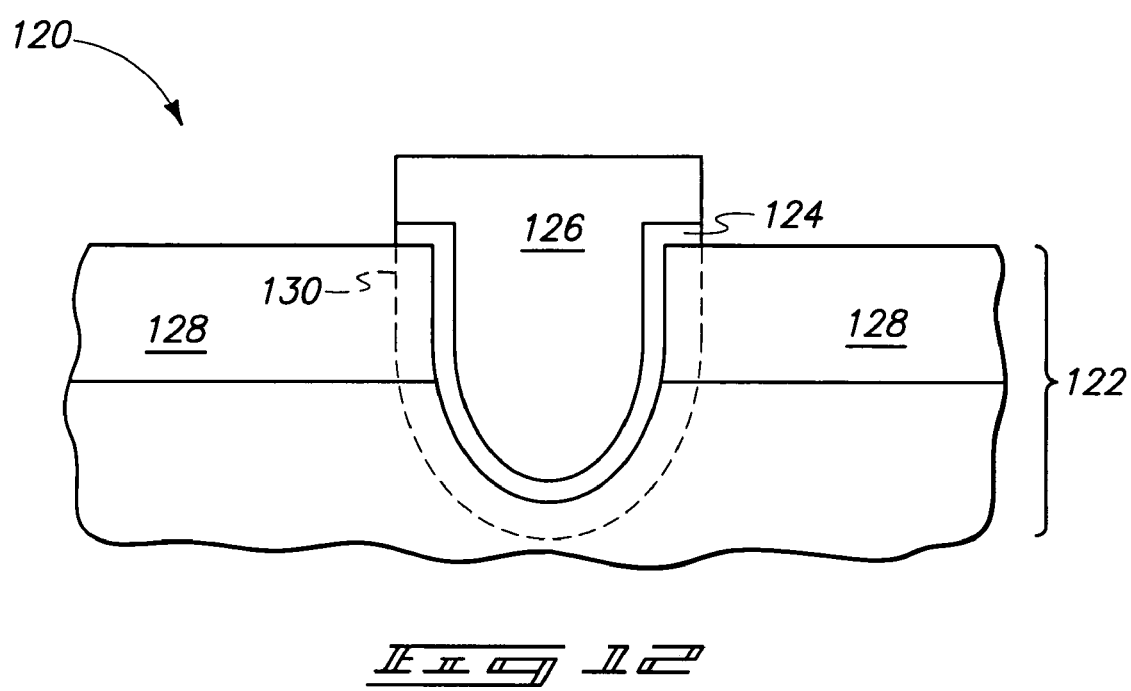
FIG. 12 is a partial, sectional view of a transistor containing SiC according to still another aspect of the invention.

FIG. 12 shows a transistor 120 that may be included within a memory cell. Transistor 120 includes a SiC layer 130 as a part of a semiconductor substrate 122 and source/drain regions 128 formed within substrate 122. A gate dielectric 124 is formed over SiC layer 130 and a gate 126 is formed over gate dielectric 124. Gate 126 is referred to as a "recessed gate" since it is located within a recess formed in substrate 122. A transistor channel extends between source/drain regions 128 through substrate 122 and includes SiC layer 130. SiC layer 130 is also included in source/drain regions 128. Transistor 120 with recessed gate 126 represents one example of a structure having a SiC-containing channel operationally associated with opposing sides of a gate.

One advantage of a recessed gate device is that it provides a longer gate length for a given feature area. A typical planar gate within the same feature area may have a much shorter gate length. Conventionally, transistors are often formed with the gate dielectric on a monocrystalline silicon surface exhibiting a <100> crystallographic orientation. As known to those of ordinary skill, forming the gate dielectric on the <100> silicon reduces the interface charge density of the transistor. With a recessed gate, only a small portion of the recess walls that happen to be parallel with the <100> plane will posses a <100> orientation. Instead the recess walls may be <110> and other orientations depending upon their shape. Accordingly, increased interface charge density may result for a recessed gate device. Fortunately, a SiC-containing channel according to the present aspect of the invention may advantageously mitigate the otherwise increased interface charge density because of the SiC material properties described herein.

In a further aspect of the invention, a memory cell includes a semiconductive substrate, a first transistor source/drain region in the semiconductive substrate, a second transistor source/drain region in the semiconductive substrate, and a transistor channel that does not contain SiC between the first and second source/drain regions. A storage node junction is on the first source/drain region and a digit node junction is on the second source/drain region. The storage node junction and/or digit node junction include a carbonated portion of the semiconductive substrate that contains SiC. By way of example, if the storage node junction contains SiC, then the SiC has a thickness of from about 200 to about 500 Angstroms. If the digit node junction contains SiC, then the SiC has thickness of from about 50 to about 150 Angstroms. The storage and/or digit node junction containing SiC may be on epitaxial silicon of the respective source/drain region. The epitaxial silicon may be elevationally above the channel, as in a raised source/drain configuration or other configuration.

FIG. 10 shows a transistor 80 that may be included within a memory cell. Transistor 80 includes a semiconductive substrate 78, a source/drain region 88 formed within substrate 78, a source/drain region 90 formed within substrate 78, and a transistor channel 89 that does not contain SiC between source/drain regions 88 and 90. A storage node junction 94 is on source/drain region 90 and a digit node junction 94 is on source/drain region 88. Notably, storage node junction 92 includes a SiC layer 82 also within source/drain region 90. Digit node junction 94 contains a SiC layer 83 within source/drain region 88. As shown by a relative comparison of the thicknesses of SiC layer 82 and SiC layer 83, the SiC of storage node junction 92 has a greater thickness than the SiC of digit node junction 94. Such thickness differences accommodate the general preference for a deeper junction at a storage node in comparison to a digit node. A gate dielectric 84 is formed over channel 89 and a gate 86 is formed over gate dielectric 84.

FIG. 11 shows a transistor 100 that may be contained within a memory cell and includes similar features to those discussed above regarding transistor 80 in FIG. 10, with like reference numerals denoting like components. Transistor 100 includes a raised source/drain 96 that includes a storage/digit node junction 98 therein containing SiC. Spacers 102 separate raised source/drain 96 from gate 86. Certain conventional configurations for transistors provide a raised source/drain through epitaxial growth of silicon to an elevational level above the channel. Given recent advancements in epitaxial growth techniques of SiC, such epitaxial growth can be combined with epitaxial growth of silicon for a raised source/drain. Process conditions of the growth process may be changed once a desired height for epitaxial silicon is reached such that additional growth provides SiC in the raised source/drain.

As will be appreciated from the discussions herein, the beneficial aspects of providing SiC in storage/digit node junctions to reduce junction leakage may also be applicable to the transistors having gates on opposing sides of a channel containing SiC, for example, 3-D transistors. Similarly, SiC-containing storage/digit node junctions may be included in memory devices with an array of memory cells including carbonated portions of a semiconductive substrate and peripheral devices that do not include any carbonated portions of the semiconductive substrate.

Depending upon process conditions and methodologies known to those of ordinary skill for incorporating SiC into storage/digit node junctions, defects may be introduced at the interface between SiC and Si in the source/drain region. Accordingly, the disadvantages of such added defects might potentially outweigh any advantages in reducing junction leakage in the storage/digit node junction. As such, a configuration that does not take advantage of performance enhancements available with SiC-containing channels is less desirable. Even so, such embodiments are presented herein as encompassed by various aspects of the present invention.

Possible disadvantages of providing SiC in node junctions includes increased defect density, higher leakage current if defects are not controlled, and some added processing complexity resulting from integrating the SiC. However, possible advantages include reduced junction leakage if defects are controlled and/or their location optimized and shallower junction depths due to less dopant diffusion in the presence of carbon in the SiC. Shallow junction depths are a highly desirable improvement in source/drain regions to control subthreshold leakage.

Possible advantages of providing SiC in channels includes reduction in leakage current, much reduced drain-induced barrier lowering (DIBL), toleration of high bias burn-in conditions (high temperature, high electric field), ability to reduce threshold voltage for low-power DRAM, and further scaling of access devices. As known to those of ordinary skill, DIBL refers to lowering of the source injection barrier with respect to increasing drain bias and is not desirable, causing more leakage. SiC-containing channels can reduce DIBL by lessening the dependence of the source injection barrier on drain bias. Even at high drain bias, the source injection barrier is not lowered as significantly compared to a channel lacking the SiC.

Reducing leakage current may provide a variety of benefits, one of which includes allowing threshold voltage ($V_t$) and gate-source voltage ($V_{gs}$) to be lowered for low-power applications, including DRAM. As known to those of ordinary skill, efforts to lower $V_t$ and $V_{gs}$, reducing power consumption, are limited by high leakage current. Accordingly, if leakage current can be decreased by using the SiC-containing channels of the aspects of the invention, then $V_t$ and $V_{gs}$ can be lowered for low-power DRAM.

Figure 13:
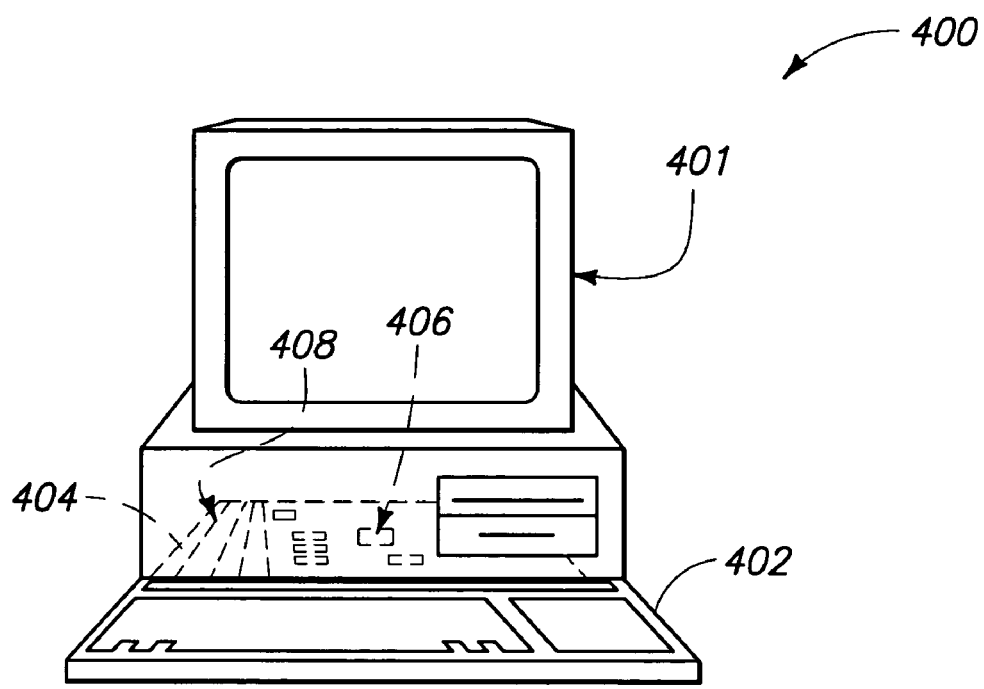
FIG. 13 is a diagrammatic view of a computer illustrating an exemplary application of the present invention.
Figure 14:
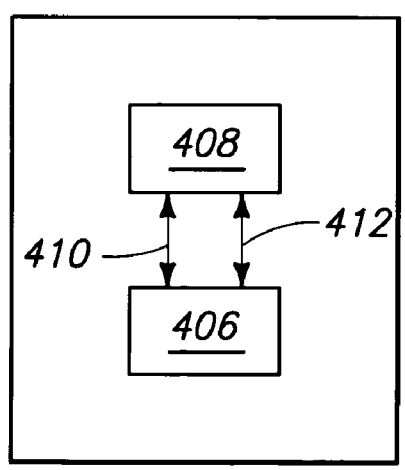
FIG. 14 is a block diagram showing particular features of the motherboard of the FIG. 13 computer.

FIG. 13 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 14. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternative type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 15:
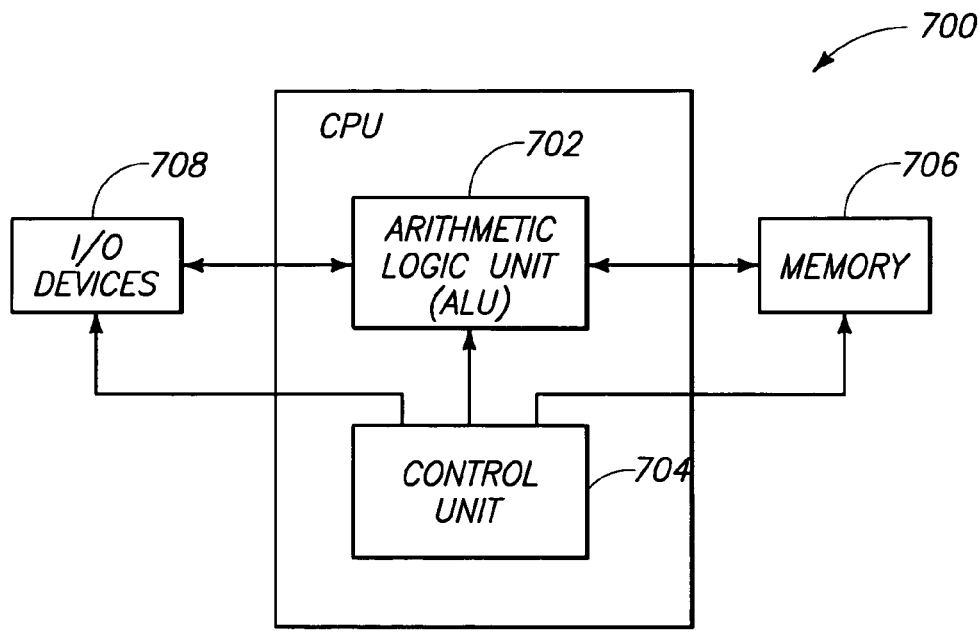
FIG. 15 is a high level block diagram of an electronic system according to an exemplary aspect of the present invention.

FIG. 15 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 16:
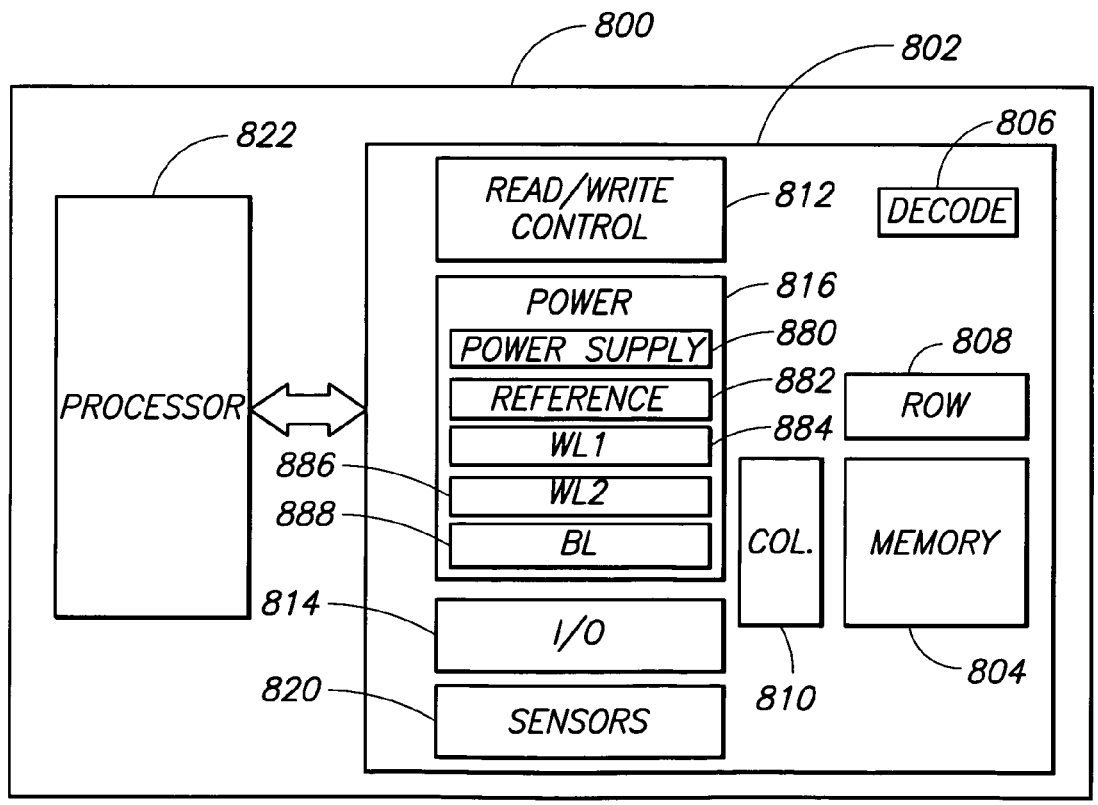
FIG. 16 is a simplified block diagram of an exemplary memory device according to an aspect of the present invention.

FIG. 16 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for the memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A memory device comprising:
a semiconductive substrate;
an array of memory cells over the substrate, at least some of the individual memory cells including a transistor having:
a first source/drain;
a second source/drain;
a channel containing a carbonated portion of the semiconductive substrate that contains SiC between the first and second sources/drains; and
a gate operationally associated with opposing sides of the channel; and
peripheral devices including memory cell addressing circuitry and memory cell read circuitry over the substrate, at least some of the peripheral devices not including any carbonated portions of the semiconductive substrate.

2. The device of claim 1 wherein the carbonated portions are conductively doped.

3. The device of claim 1 wherein at least one component of each of the individual memory cells includes one of the carbonated portions.

4. The device of claim 1 wherein none of the peripheral devices include one of the carbonated portions.

5. The device of claim 1 wherein the semiconductive substrate comprises monocrystalline silicon.

6. The device of claim 1 wherein the semiconductive substrate comprises epitaxial silicon.

7. The device of claim 1 wherein the transistor comprises a vertical transistor with the channel elevationally above the first source/drain and the second source/drain elevationally above the channel.

8. The device of claim 1 wherein the transistor comprises a lateral transistor with some portion of each of the first source/drain, the second source/drain, the gate, and a current path through the channel sharing one common elevational level.

9. The device of claim 1 further comprising a gate dielectric between the gate and the channel, the SiC of the channel being located within a channel periphery proximate an interface with the gate dielectric and not being located within a channel core at least partly surrounded by the SiC, the channel core extending from the first source/drain to the second source/drain.

10. The device of claim 1 comprised by DRAM, SRAM, or flash memory.

11. A memory device comprising:
a semiconductive substrate;
an array of memory cells over the substrate, at least some of the individual memory cells including a portion of a planar SiC layer in the semiconductive substrate and a transistor that includes the SiC layer in a first source/drain, a second source/drain, and a channel between the first and second sources/drains; and peripheral devices including memory cell addressing circuitry and memory cell read circuitry over the substrate, at least some of the peripheral devices not including any carbonated portions of the semiconductive substrate.

12. A random access memory device comprising:
a silicon substrate;
an array of memory cells over the substrate, each of the individual memory cells including a conductively doped, planar SiC layer in the semiconductive substrate and including a transistor that includes the SiC layer in a first source/drain, a second source/drain, and a channel between the first and second sources/drains; and
peripheral devices including memory cell addressing circuitry and memory cell read circuitry over the substrate, none of the peripheral devices including any SiC layer in the semiconductive substrate.

13. The device of claim 12 wherein the semiconductive substrate comprises monocrystalline silicon.

14. The device of claim 12 wherein the semiconductive substrate comprises epitaxial silicon.

15. A memory device comprising a vertical transistor having:
a semiconductive substrate;
a first source/drain;
a second source/drain;
a channel including a carbonated portion of the semiconductive substrate that contains SiC between the first and second sources/drains, the channel extending from the first source/drain to the second source/drain, the channel being elevationally above the first source/drain, and the second source/drain being elevationally above the channel; the first source/drain, the second source/drain, and the channel having cylindrical peripheries; and
a gate operationally associated with the channel.

16. The memory device of claim 15 comprised by DRAM, SRAM, or flash memory.

17. The device of claim 15 wherein the channel has a maximum horizontal width which is smaller than each of the maximum horizontal widths of the first source/drain and the second source/drain.

18. The device of claim 15 wherein the first source/drain and the second source/drain have the same maximum horizontal width.

19. The device of claim 18 wherein the channel has a maximum horizontal width which is different from the maximum horizontal width of the first source/drain and the second source/drain.

20. The device of claim 19 wherein the channel maximum width is smaller than the maximum horizontal width of the first source/drain and the second source/drain.

21. A vertical transistor comprising:
a semiconductive substrate;
a first source/drain;
a second source/drain;
a channel including a carbonated portion of the semiconductive substrate that contains SiC between the first and second sources/drains, the channel having opposing sides that extend from the first source/drain to the second source/drain, the channel being elevationally above the first source/drain, and the second source/drain being elevationally above the channel;
a gate operationally associated with the opposing sides of the channel; and
a gate dielectric between the gate and the channel, the SiC of the channel being located within a channel periphery proximate an interface with the gate dielectric and not being located within a channel core at least partly surrounded by the SiC, the channel core extending from the first source/drain to the second source/drain.

22. The transistor of claim 21 wherein the SiC has a thickness of from about 50 to about 100 Angstroms.

23. A transistor comprised by a memory device,
the transistor comprising:
a semiconductive substrate;
a first source/drain;
a second source/drain;
a gate recessed into the semiconductive substrate between the first and second sources/drains; and
a channel including a carbonated portion of the semiconductive substrate that contains SiC operationally associated with opposing sides of the gate; and
the memory device further comprising:
an array of memory cells over the substrate, an individual memory cell including the transistor; and
peripheral devices including memory cell addressing circuitry and memory cell read circuitry over the substrate, at least some of the peripheral devices not including any carbonated portions of the semiconductive substrate.

24. The transistor of claim 23 further comprising a gate dielectric between the gate and the channel, the SiC of the channel being located within a channel periphery proximate an interface with the gate dielectric.

25. The transistor of claim 24 wherein the SiC has a thickness of from about 50 to about 100 Angstroms.

26. The transistor of claim 23 comprised by DRAM, SRAM, or flash memory.

* * * * *